United States Patent [19]
Bartlett

[11] Patent Number: 5,644,309
[45] Date of Patent: Jul. 1, 1997

[54] DIGITAL COMONENT TESTING APPARATUS AND METHOD

[75] Inventor: William David Bartlett, Melbourne Beach, Fla.

[73] Assignee: Harris Corporation, Melbourne, Fla.

[21] Appl. No.: 419,610

[22] Filed: Apr. 10, 1995

[51] Int. Cl.⁶ ......................................... H03M 1/10
[52] U.S. Cl. ............................. 341/120; 341/155
[58] Field of Search ............................ 341/120, 155, 341/118

[56] References Cited

U.S. PATENT DOCUMENTS

| | | | |
|---|---|---|---|
| 4,352,160 | 9/1982 | Frech et al. | 364/553 |
| 4,354,177 | 10/1982 | Sloane | 341/120 |
| 4,897,650 | 1/1990 | Shott, III et al. | 341/120 |
| 5,063,383 | 11/1991 | Bobba | 341/120 |
| 5,332,996 | 7/1994 | Guzinski et al. | 341/120 |

*Primary Examiner*—Marc S. Hoff
*Attorney, Agent, or Firm*—Rogers & Killeen

[57] ABSTRACT

Method and apparatus for testing electrical devices which generate digital signals from analog signals applied to the devices. The testing determines whether or not the electrical devices are capable of properly generating all the different digital codes that correspond to the different analog signals in a particular bandwidth. The method and apparatus provide an external signal indicating whether an electrical device being tested functions properly.

28 Claims, 3 Drawing Sheets

DIGITAL COMONENT TESTING APPARATUS AND METHOD

BACKGROUND OF THE INVENTION

The present invention relates to methods and apparatus for testing electrical devices which generate digital signals from analog signals that are applied to the devices.

After an electrical device which generates digital signals related to analog signals, such as an analog-to-digital converter ("ADC"), is manufactured it is desirable to test the device to determine if it functions properly. A properly functioning ADC should generate the full range of digital signals which correspond to the full range of analog signals in the bandwidth which are applied to the ADC.

Previous methods of testing ADC's for digital signal generation have required the use of significant amounts of software and computer overhead. The previous methods may also require up to 30 seconds or more to test one ADC for generation of all digital signals.

The apparatus of the present invention utilizes hardware (an electrical circuit) to test an ADC. ADC's which took 30 seconds to test using prior methods may be tested in little more than a second using the novel methods and apparatus of the present invention.

Accordingly, an object of the present invention is to provide a novel method for testing electrical devices to determine whether the devices properly generate digital signals related to analog signals applied to the device.

Another object of the present invention is to provide a novel circuit for testing electrical devices for the proper generation of digital signals related to analog signals applied to the device.

A further object of the present invention is to provide external indication of whether an electrical device which generates digital signals related to analog signals applied to the device does or does not function properly.

These and many other objects and advantages of the present invention will be readily apparent to one skilled in the art to which the invention pertains from a perusal of the claims, the appended drawings, and the following detailed description of the preferred embodiments.

DESCRIPTION OF PREFERRED EMBODIMENTS

Figure 1:
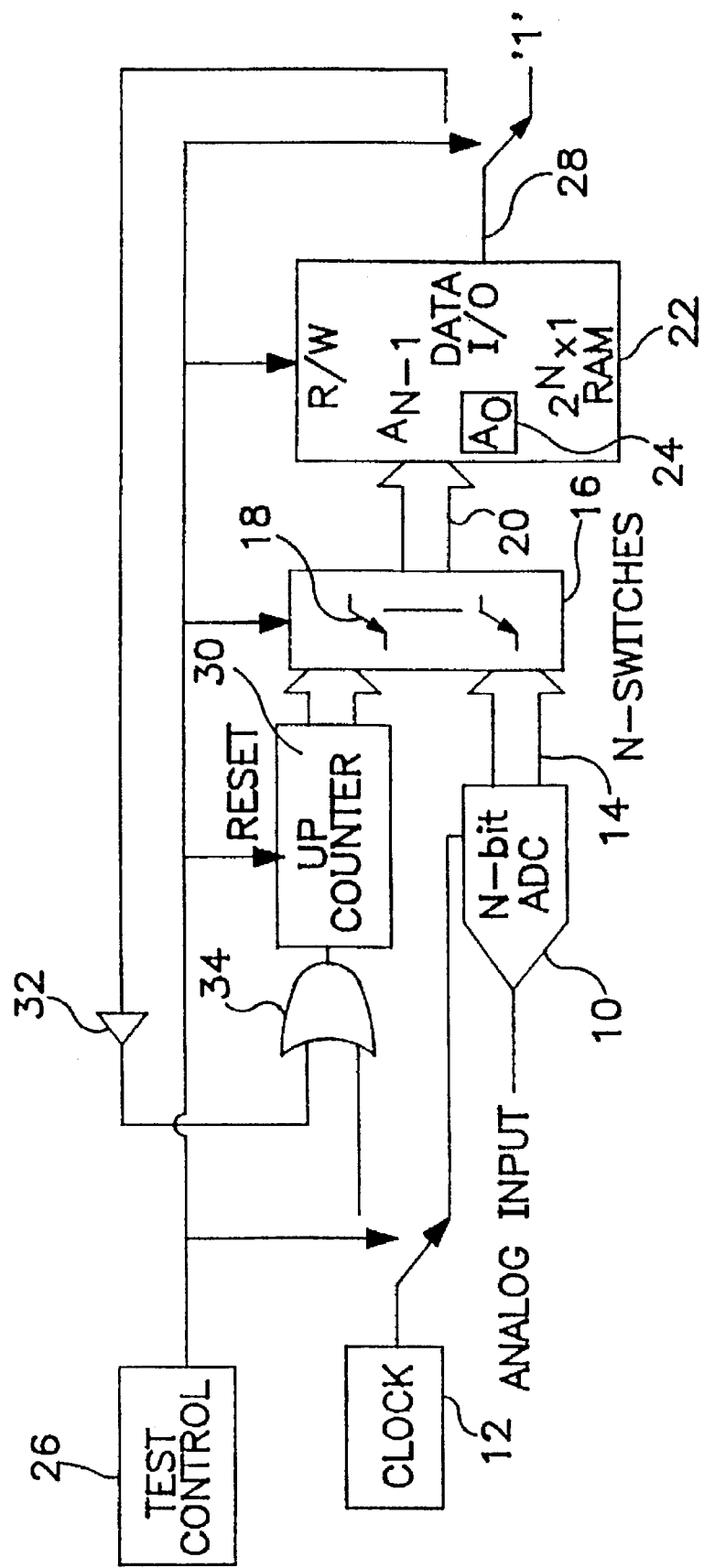
FIG. 1 is a circuit diagram illustrating a novel circuit for carrying out a method of the invention.

In a preferred embodiment of the novel method, analog signals are applied to an electrical device, such as an analog-to-digital converter 10 (ADC) shown in FIG. 1, during a first stage of the method. A properly functioning ADC generates digital signals related to the applied analog signals. For convenience of explanation, the present method will be described as it may be used with an ADC, although it is to be understood that the method may be used with any electrical device capable of generating digital signals related to analog signals.

The analog signals applied to the ADC preferably have a bandwidth at least as great as the predetermined bandwidth of the ADC, i.e. at least as great as the bandwidth of the analog signals the ADC is supposed to be capable of converting to digital signals. Application of analog signals covering the full range of the predetermined bandwidth of the ADC assures that the ADC will have the opportunity to generate all the different possible digital signals corresponding to the analog signals in the predetermined bandwidth. Additionally, a large number of cycles of the analog signals may be applied to the ADC to further guarantee that all possible related digital signals will be generated if the ADC is functioning properly.

Clocking signals are applied from a clock 12 to the ADC 10 at the same time the analog signals are being applied thereto, thereby driving the ADC to generate digital signals at an ADC output 14. The clock 12 is selectively connected to the ADC during the time the ADC is generating digital signals in response to received analog signals.

Once the digital signals are generated, they are applied in turn from the ADC output 14 to a bank of switches 16. The bank of switches temporarily stores the bit sequence of each of the generated digital signals as it is output from the ADC. The number of switches in the bank should be equivalent to or greater than the number of bits in the digital signals, so that there is a switch 18 (i.e. a temporary storage location) for each bit in the digital signal.

After an individual digital signal (including all of its component bits) is resident in the bank of switches, the digital signal is applied from the bank of switches output 20 to a RAM 22. Each complete digital signal serves as a RAM address, therefore the RAM should have at least as many storage cells 24 as there are different possible digital codes that may be generated by the ADC. Preferably, $2^N$ storage cells will be provided when the digital signals output from the ADC are N bits in length. However many storage cells are provided, the steps of generating an individual digital signal, applying it to the bank of switches and from the bank of switches to the RAM, will have to be repeated a number of times equivalent to the number of storage cells.

Still during this first stage of the method, while the ADC is generating digital signals, the RAM input/output (I/O) port 28 is selected to write a "code present" signal to each of the storage cells which are addressed by the bank of switches output. Accordingly the writing of a "code present" signal to a particular storage cell is ultimately dependent upon the generation by the ADC of a digital code corresponding to that address.

If the ADC generates all the different possible digital signals for the predetermined ADC bandwidth, then there will be a "code present" signal in a storage cell for each and every different digital signal the ADC was supposed to be capable of generating. If, however, the ADC does not generate a particular digital signal that the ADC should have generated given the analog signals applied, then the storage cell with an address corresponding to that particular digital signal will not contain a "code present" signal.

The first stage of the method is complete when a sufficient number of analog signals have been applied to the ADC such that all the digital signals the ADC is capable of generating should have been generated, and all the storage cells with addresses corresponding to the generated digital signals will have had a "code present" signal stored therein.

The object of the second stage of the method is to read the signals present in each of the storage cells (the "resident signals") after the completion of the first stage of the method, i.e., to scan the RAM 22. The resident signals are read to determine if any of the storage cells do not contain a "code present" signal, which would indicate that the ADC failed to generate the digital signal corresponding to the address of the storage cell in question.

With continued reference to FIG. 1, the second stage of the method is initiated by a test control 26 setting the I/O port 28 of the RAM 22 to read, and resetting an up counter 30, so that the up counter generates an initial digital signal and applies the signal to the bank of switches 16. The digital signals generated by the up counter should have the same number of bits as the digital signals generated by the ADC 10, so that they may also serve as storage cell addresses.

The initial digital signal is applied from the bank of switches, through the bank of switches output 20, to the RAM 22 as an address. The initial digital signal will correspond to an address for an initial storage cell 24 in the RAM 22. When the storage cell 24 is addressed, the signal stored within the storage cell (either a "code present" signal or not a "code present" signal) will be read by the I/O port 28, and applied therefrom to an inverter 32. The signal applied to the inverter will be inverted and the resultant signal will in turn be applied to a logic device 34.

The logic device receives input signals from both the inverter 32 and the clock 12. Selective connection of the clock to the logic device 34 may be controlled by test control device 26. When the logic device receives both a clocking signal from the clock 12 and an inverted "code present" signal from the inverter 32, a signal is output from the logic device to the up counter 30, thereby incrementing the up counter to generate a successive digital signal to that last generated.

The successive digital signal generated by the up counter is applied to the bank of switches 16 and the RAM 22, just as the initial digital signal was. The successive digital signal corresponds to an address for a storage cell successive to that of the initial storage cell. Accordingly, the generation of the successive digital signal causes the reading of the resident signal in the next storage cell.

The steps of the preceding two paragraphs are repeated so that a series of successive addresses for the storage cells is generated and so that the respective resident signals in the storage cells are read. If a "code present" signal is resident in each successive storage cell, the up counter will be incremented to generate a successive digital signal until all of the storage cells have been read. After the last storage cell is read and determined to have a "code present" signal resident therein, the test control may indicate there are "no missing codes".

If a "code present" signal is absent from any one of the storage cells having an address corresponding to a digital signal which should have been generated by the ADC, then the up counter will not be incremented, and an alarm signal will be generated by the test control 26. More specifically an alarm signal is generated by the test control 26 as the result of a "non-code present" signal being read from a storage cell and applied through the inverter 32 to the logic device 34. The application of a clocking signal and the "non-code present" signal to the logic device does not cause a signal to be output from the logic device to the up counter 30. The up counter's failure to increment (as a result of not receiving a signal from the logic device) may then be detected by the test control and an appropriate alarm signal generated.

Figure 2:
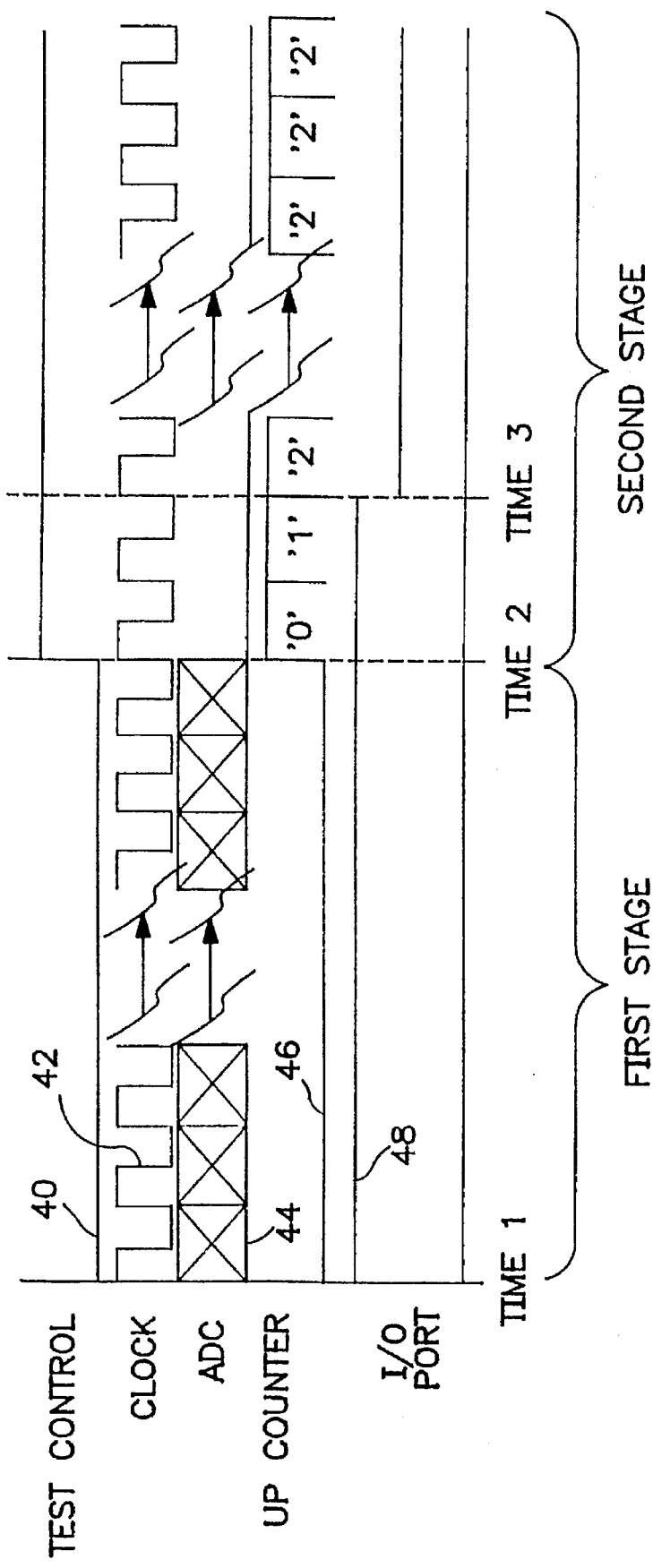
FIG. 2 is a timing diagram illustrating the signal outputs for devices which are part of a novel circuit for carrying out a method of the invention.
Figure 3:
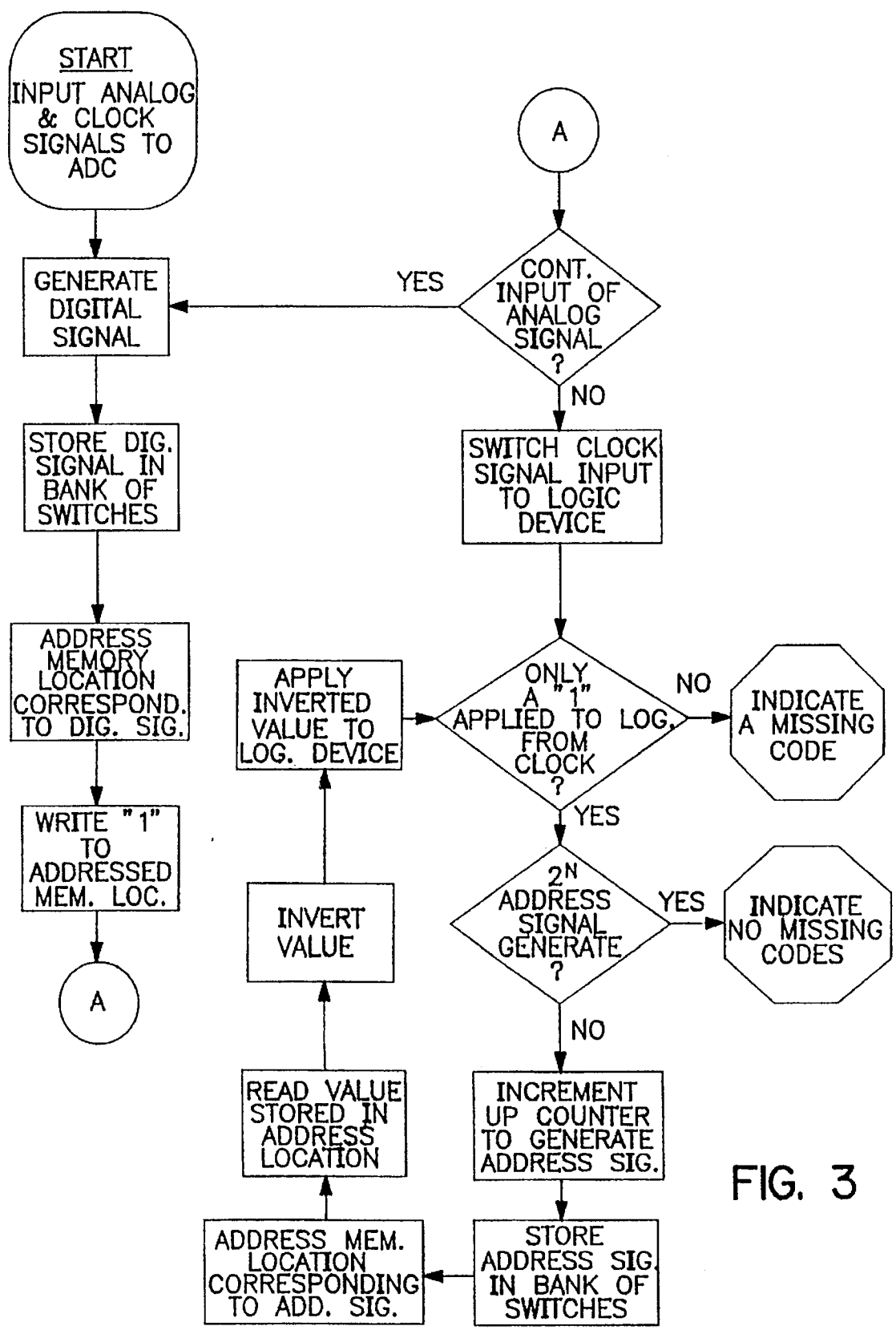
FIG. 3 is a flow chart illustrating the steps included in one embodiment of a method of the invention.

Referring to the signal timing diagram of FIG. 2, the test control signals 40, clock signals 42, ADC signals 44, up counter signals 46, and I/O port signals 48 are depicted for the first and second stages of the presently described method.

Time 1 designates the time at which analog signals are first applied to the ADC. Analog signals in the predetermined bandwidth are continuously applied after time 1 until time 2. The timing diagram shows that between time 1 and time 2, the up counter and the test control signals remain low, the I/O port signals remain high, and the clock signals are regularly cyclical.

The analog signals cease to be applied to the ADC after time 2. Correspondingly, the test control and up counter signals remain high after time 2 until time 3, the time when a "code present" signal fails to be resident in a storage cell being read thereby causing the I/O signal to go from high to low. The timing diagram shows time 3 as occurring after the second storage cell is read and no "code present" signal is found to be resident therein.

While preferred embodiments of the present invention have been described, it is to be understood that the embodiments described are illustrative only and the scope of the invention is to be defined solely by the appended claims when accorded a full range of equivalence, many variations and modifications naturally occurring to those of skill in the art from a perusal hereof.

What is claimed is:

1. A method of testing an analog to digital converter comprising the steps of:
   a) providing an analog-to-digital converter ("ADC") having a predetermined input signal range and an N bit digital output;
   b) providing a memory of a length of $2^N$ cells;
   c) applying to an input of the ADC an analog signal having a signal range at least as large as the predetermined input signal range;
   d) clocking the ADC to generate a digital output signal;
   e) storing at the address of the memory cell indicated by the digital output signal, a signal indicating "code present";
   f) repeating steps (c)–(e) at least $2^N$ times; and
   g) scanning the memory to determine the cells which do not have a "code present" signal.

2. The method of claim 1 wherein said scanning step further comprises the steps of:
   h) clocking an up counter to generate successive address signals;
   i) reading the cell of the memory at the generated address signal;
   j) comparing the contents of said read cell to the "code present" signal and generating an alarm signal if the "code present" signal is not found; and
   k) repeating steps (h)–(j) until all memory cells have been compared.

3. The method of claim 2 wherein the step of clocking the up counter comprises applying a signal related to the contents of a read cell to the up counter.

4. The method of claim 3 wherein the up counter generates successive address signals in response to a signal from a logic device.

5. The method of claim 4 wherein said logic device receives clocking signals and signals related to the contents of read cells.

6. The method of claim 5 wherein said signals related to the contents of read cells are passed through an inverter.

7. The method of claim 2 further comprising the step of:
   (1) indicating "no missing codes" if an alarm signal is not generated.

8. The method of claim 1 wherein said storing step further comprises the steps of:

h) applying the digital output signal to a bank of N switches so that the digital output signal is stored by the bank of switches as a digital code;

i) applying the digital code to the memory as an address;

j) writing a "code present" signal to the addressed memory cells.

9. A method of verifying the generation of all possible digital codes from the application of an analog input signal to an analog-to-digital converter, comprising the steps of:

a) providing a number of memory cells equal to the number of all possible digital codes that could be generated by the converter;

b) storing a "code present" signal in each memory cell having an address corresponding to each of the digital codes generated by the converter;

c) reading the signal resident in each of the provided memory cells; and d) generating an alarm signal corresponding to the address of a memory cell not having a "code present" signal stored therein.

10. The method of claim 9 further comprising the step of:

(e) indicating "no missing codes" if an alarm signal is not generated.

11. The method of claim 9 further comprising the step of generating the address for each of the provided memory cells with an up counter.

12. A method of testing an analog to digital converter comprising the steps of:

a) applying an analog signal to an analog to digital converter (ADC);

b) applying a clock signal to the ADC;

c) generating an N bit digital code with the ADC;

d) applying said generated digital code to a bank of N switches;

e) applying said generated digital code to a memory device to address a memory cell corresponding to the digital code;

f) writing a "code present" signal to the addressed memory cell thereby storing the "code present" signal in the addressed memory cell;

g) repeating steps (c) through (f) at least $2^N$ times;

h) upon the completion of step (g), discontinuing the application of the clock signal to the ADC;

i) applying the clock signal to a logic device;

j) applying an output signal from the logic device to an up counter;

k) generating an N bit address code with the up counter;

l) applying said generated address code to the bank of N switches;

m) applying said generated address code to the memory device thereby addressing a memory cell corresponding to the address code;

n) reading the signal stored in the addressed memory cell and applying a signal related thereto to the logic device;

o) indicating a "missing code", if the signal read from the addressed memory cell is not a "code present" signal;

p) repeating steps (i) through (o) until, (1) the signal read from the addressed memory cell is not a "code present" signal, or (2), steps (i) through (o) have been repeated $2^{N-1}$ times; and q) indicating "no missing codes" if steps (i) through (p) are repeated $2^{N-1}$ times.

13. A testing circuit for testing electrical devices having at least one analog input terminal and N digital output terminals comprising:

a logic device having an output terminal and two input terminals;

a clock selectively connected to either a device to be tested or a logic device;

an up counter having an input terminal connected to the output terminal of said logic device, and having N digital output terminals;

a bank of N switches having input terminals connected to said up counter output terminals and having an output terminal;

a memory device having at least $2^N$ addressable memory cells, having an address terminal connected to said switches output terminal, and having an output terminal; and a data input/output switch having an input terminal connected to said memory device output terminal, and having an output terminal operatively connected to an input terminal of said logic device.

14. The testing circuit of claim 13 further comprising:

a test control device operatively connected to said clock, up counter, switches, and memory device.

15. The testing circuit of claim 14 wherein said test control device selectively connects said bank of N switches to either the up counter output terminals or to an output terminal of said device being tested.

16. The testing circuit of claim 14 wherein said test control device selectively connects said clock to either the logic device or said device being tested.

17. The testing circuit of claim 13 wherein said memory cells are scanned for the presence of a "code present" signal and an alarm signal is generated if a "code present" signal is not found in each of said memory cells.

18. A method of testing an electrical device having an analog input and an N-bit digital output comprising the steps of:

a) providing an electrical device having a predetermined input signal range;

b) providing a memory of a length of $2^N$ cells;

c) applying to the input of the electrical device an analog signal having a signal range at least as large as the predetermined input signal range;

d) clocking the electrical device to generate a digital output signal;

e) storing at the address of the memory cell indicated by the digital output signal, a signal indicating "code present";

f) repeating steps (c)–(e) at least $2^N$ times; and g) scanning the memory to determine the cells which do not have a "code present" signal.

19. The method of claim 18 wherein said scanning step further comprises the steps of:

h) clocking an up counter to generate successive address signals;

i) reading the cell of the memory at the generated address signal;

j) comparing the contents of said read cell to the "code present" signal and generating an alarm signal if the "code present" signal is not found; and k) repeating steps (h)–(j) until all memory cells have been compared.

20. The method of claim 19 wherein the step of clocking the up counter comprises applying a signal related to the contents of a read cell to the up counter.

21. The method of claim 20 wherein the up counter generates successive address signals in response to a signal from a logic device.

22. The method of claim 21 wherein said logic device receives clocking signals and signals related to the contents of read cells.

23. The method of claim 22 wherein said signals related to the contents of read cells are passed through an inverter.

24. The method of claim 19 further comprising the step of:
   (l) indicating "no missing codes" if an alarm signal is not generated.

25. The method of claim 18 wherein said storing step further comprises the steps of:
   h) applying the digital output signal to a bank of N switches so that the digital output signal is stored by the bank of switches as a digital code;
   i) applying the digital code to the memory as an address;
   j) writing a "code present" signal to the addressed memory cells.

26. A method of testing a device which provides an N bit digital output from an analog input comprising the steps of:
   (a) applying an analog test signal to the device so that the device generates all values of its N bit digital output when the device is operating properly;
   (b) addressing a memory with each of the generated values, the memory having a cell address for each of the values of the device's digital output;
   (c) in each of the memory's cells, storing a binary indication whether the cell was addressed;
   (d) logically evaluating the binary indication in each of the cells to determine whether all the cells have been addressed; and
   (e) indicating when one of the cells has not been addressed.

27. The method of claim 26 wherein the step of addressing a memory comprises, for each of the generated values, the steps of storing each of the generated values in a bank of N switches as a digital code, and applying the digital code to the memory as the cell address.

28. The method of claim 26 wherein the step of logically evaluating comprises the steps of providing each binary indication to a binary logic device in conjunction with a timing signal.

* * * * *